United States Patent [19]

Matsumoto et al.

[11] Patent Number: 4,981,433
[45] Date of Patent: Jan. 1, 1991

[54] SHEET HEATING DEVICE

[75] Inventors: Yumio Matsumoto, Kasugai; Yasuo Kimuya, Ichinomiya; Osamu Takagi, Nagoya; Yuji Asano, Nagoya, all of Japan

[73] Assignee: Brother Kogyo Kabushiki Kaisha, Aichi, Japan

[21] Appl. No.: 420,893

[22] Filed: Oct. 13, 1989

[30] Foreign Application Priority Data

| Oct. 15, 1988 | [JP] | Japan | 63-134813 |
| Oct. 27, 1988 | [JP] | Japan | 63-140364 |
| Oct. 27, 1988 | [JP] | Japan | 63-140365 |
| Oct. 27, 1988 | [JP] | Japan | 63-140366 |
| Oct. 31, 1988 | [JP] | Japan | 63-142146 |

[51] Int. Cl.⁵ .................. H05B 1/00; G03G 15/12; G03G 15/20
[52] U.S. Cl. .................. 432/59; 355/30; 219/216; 34/41
[58] Field of Search .................. 432/8, 10, 59; 34/23, 34/41, 155; 219/216, 388, 400

[56] References Cited

U.S. PATENT DOCUMENTS

| 2,852,651 | 9/1958 | Crumrine et al. |
| 3,053,962 | 9/1962 | Cerasani et al. |
| 3,187,162 | 6/1965 | Hojo et al. ............... 34/41 X |
| 3,440,944 | 4/1969 | Endermann et al. ........ 219/216 X |
| 3,717,747 | 2/1973 | Fuyuki . |
| 3,806,314 | 4/1974 | Obuchi et al. ............ 219/216 X |
| 4,019,054 | 4/1977 | Saito et al. |
| 4,088,868 | 5/1978 | Zeuthen . |
| 4,336,279 | 6/1982 | Metzger ................... 34/41 X |
| 4,638,572 | 1/1987 | Fleissner ................. 34/41 |

FOREIGN PATENT DOCUMENTS 2532253 4/1977 Fed. Rep. of Germany .
2613066 9/1977 Fed. Rep. of Germany .

Primary Examiner—Henry A. Bennet
Assistant Examiner—C. Kilner
Attorney, Agent, or Firm—Oliff & Berridge

[57] ABSTRACT

A copying machine includes a sheet heating device for heating a sheet to fix a developed image thereon. The sheet heating device includes a heater unit extending transversely to and substantially fully across the sheet feed path, and an air blower for supplying air to the heater unit substantially fully across the sheet feed path and along a surface of the sheet in a direction opposite to the direction in which the sheet is fed along the sheet feed path. The sheet heating device also includes a cover covering the heater unit and the air blower and having an inlet slot and an outlet slot, and a guide plate disposed underneath the cover. The sheet heating device further includes a plurality of fixed or angularly movable air flow guide vanes for guiding an air flow from the cross-flow fan toward the heater unit. The air flow guide vanes are disposed between the heater unit and the cross-flow fan and spaced at intervals along the heater unit.

14 Claims, 7 Drawing Sheets

SHEET HEATING DEVICE

BACKGROUND OF THE INVENTION

The present invention relates to a sheet heating device for heating a sheet with hot air from a heater disposed in a sheet feed path while feeding the sheet along the sheet feed path, and more particularly, to a sheet heating device for use in a copying machine.

In various copying machines, a developed image of a hot melt material is fixed to a sheet of paper or the like with hot air heated by a heater. The hot air is forcibly applied by an air blower to the surface of the sheet which carries the image while the sheet is being fed along a sheet feed path by a sheet feeder. The hot air circulates in a cover extending around the heater. Such type of the sheet heating device is disclosed in a commonly assigned copending U.S. patent application Ser. No. 385,376 filed on July 27, 1989, and European Patent Application No. 89307763.6 filed on July 29, 1989.

SUMMARY OF THE INVENTION

It has been found that the amount of air supplied by the cross-flow fan is of such a distribution that it is progressively lower from the axially central area of the cross flow fan toward the axial ends thereof, i.e., from the transversely central area of the sheet toward the opposite lateral sides thereof. Therefore, the opposite lateral sides of the sheet are not sufficiently heated. This is disadvantageous in that the fixed image on the sheet may have irregular quality. Further, by drawing attention to the nonuniform hot air distribution given by the cross-flow fan, control of hot air distribution with respect to the sheet may be conceivable. For example, for copying a normal size sheet, uniformity in hot air distribution with respect to the sheet is required. On the other hand, for copying a reduced size image, hot air should be concentrated on a central portion of the sheet.

Further, in another aspect, in order that the temperature of the sheet along the sheet feed path will be the highest in an upstream region of the sheet feeder, the hot air is applied to the sheet in the same direction as the direction in which the sheet is fed by the sheet feeder. With this arrangement, however, the sheet is excessively heated in the upstream region of the sheet feeder, and the hot melt material on the sheet tends to produce bubbles due to boiling of the hot melt material. As a result, the fixed image on the sheet will have low quality.

In view of the aforesaid technical demands, in the sheet heating devices, it is an object of the present invention to provide a sheet heating device for applying a uniform intensity of heat to a sheet along its full width, thereby eliminating any heat irregularities which the sheet would otherwise suffer from when the sheet is heated.

Another object of the invention is to provide a sheet heating device for modifying the distribution of the amount of air supplied from a cross-flow fan so that a plurality of selectable sheet heating patterns will be available in heating a sheet.

Still another object of the invention is to provide a sheet heating device for gradually heating a sheet as it is fed so that a hot melt material deposited on the sheet as representing an image will be prevented from forming bubbles and the fixed image will be of high quality.

These and other objects of the present invention will be attained by providing a sheet heating device for heating a sheet which carries a visible image thereon, the sheet being fed along a sheet feed path while being heated, the device comprising a heater unit extending transversely to and substantially across the sheet feed path, an air blower for supplying air to the heater unit substantially fully across the sheet feed path and along the surface of the sheet, and means for regulating hot air distribution with respect to a lateral direction of the sheet.

In another aspect of the invention, there is provided a sheet heating device for heating a sheet while it is being fed along a sheet feed path comprising a heater unit extending transversely to and substantially fully across the sheet feed path, and an air blower for supplying air to the heater unit substantially fully across the sheet feed path and along a surface of the sheet in a direction opposite to the direction in which the sheet is fed along the sheet feed path. The heater unit may comprise an elongate base plate and a coil heater wound around the base plate and composed of parallel turns spaced at intervals along the base plate, or may comprise an elongate base plate and a coil heater wound around the base plate and composed of first inclined heater segments disposed at spaced intervals on one surface of the base plate and second parallel heater segments disposed at spaced intervals on the opposite surface of the base plate, the first heater segments being divided into two groups which are progressively spread away from each other from one side toward the other side of the base plate.

According to the present invention, there is also provided a sheet heating device for heating a sheet while it is being fed along a sheet feed path comprising a heater unit extending transversely to and substantially fully across the sheet feed path, a cross-flow fan for supplying air to the heater unit substantially fully across the sheet feed path and along a surface of the sheet in a direction opposite to the direction in which the sheet is fed along the sheet feed path, and a plurality of air flow guide vanes for guiding an air flow from the cross-flow fan toward the heater unit, the air flow guide vanes being disposed between the heater unit and the cross-flow fan and spaced at intervals along the heater unit.

The sheet heating device further includes a cover covering the heater unit and the cross-flow fan. The air flow guide vanes may be fixedly attached to an inner wall surface of the cover, the air flow guide vanes being divided into two groups disposed one on each side of the axial center of the cross-flow fan, the air flow guide vanes in each group being inclined toward one side of the cover in a direction away from the cross-flow fan. The air flow guide vanes may be pivotally attached at ends to the heater unit, and the sheet heating device may include a switching arm pivotally attached to the cover and a plurality of links pivotally attached to the opposite of the air flow guide vanes and the switching arm, the switching arm being angularly movable about an axis thereof for angularly moving the air flow guide arms in unison selectively between a plurality of angularly different positions. The air flow guide vanes may be pivotally attached at ends to the heater unit, and the sheet heating device may include a lever pivotally attached to the opposite ends of the air flow guide vanes, and means for moving the lever for angularly moving the air flow guide arms in unison repeatedly between angularly different positions.

The above and other objects, features and advantages of the present invention will become more apparent from the following description when taken in conjunction with the accompanying drawings in which preferred embodiments of the present invention are shown by way of illustrative example.

DETAILED DESCRIPTION OF THE PREFERRED EMBODIMENTS

Figure 1:
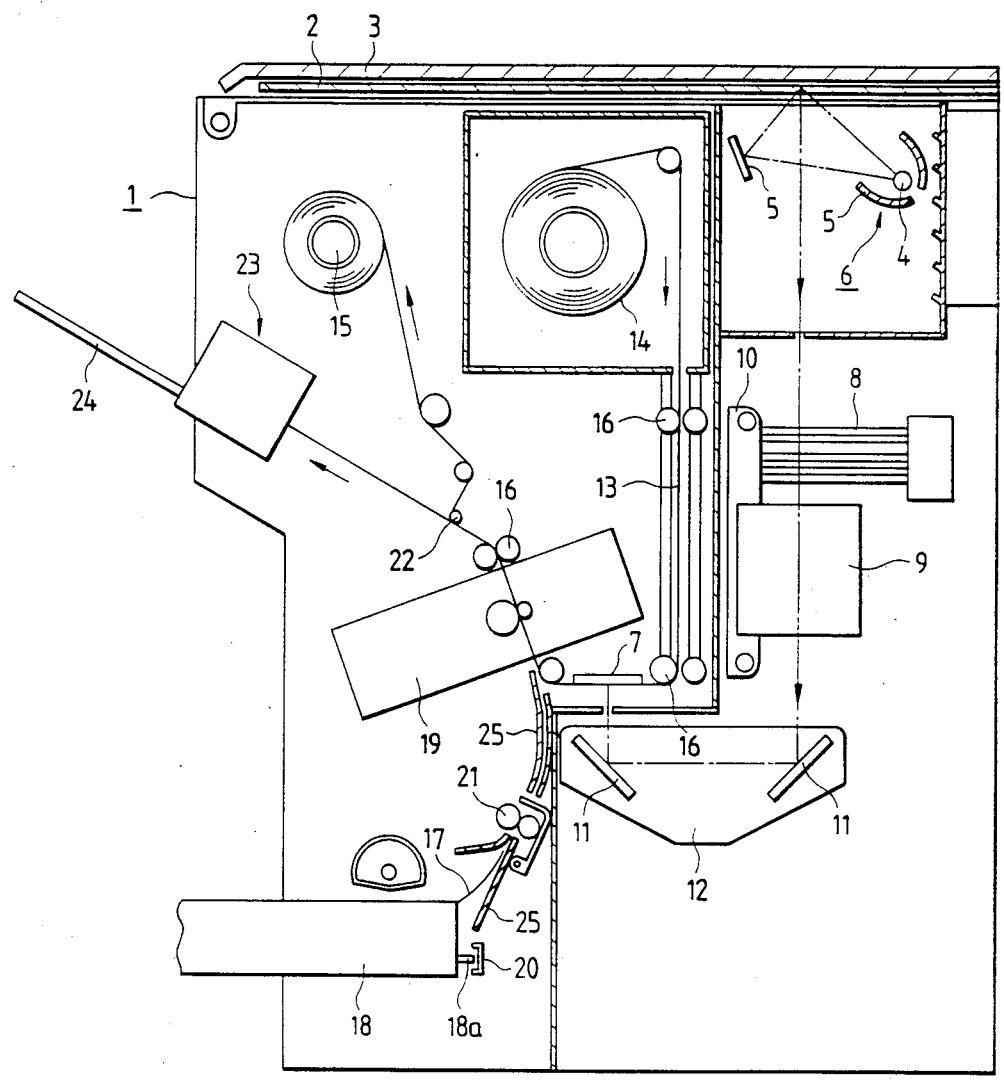
FIG. 1 is a schematic vertical cross-sectional view showing a copying machine incorporating a sheet heating device according to the present invention.

FIG. 1 shows a color copying machine incorporating a sheet heating device in accordance with the present invention. The copying machine includes a housing 1 on which there are mounted a subject holder 2 of glass for placing an original document to be copied and a cover 3 for openably covering the subject holder 2. The subject holder 2 and the cover 3 are horizontally movable on the top of the housing 1. A light source 5 for emitting light is disposed below the subject holder 2. The light source 6 comprises a halogen lamp 4 for emitting light, and a reflecting mirror 5 for reflecting the emitted light toward an original document placed on the subject holder 2. The original document on the subject holder 2 is two-dimensionally scanned or irradiated by the light when the subject holder 2 is horizontally moved over and across the light source 6 while the light is being emitted from the light source 6.

An exposure table 7 is located substantially centrally in the housing 1. Between the light source 6 and the exposure table 7, there are positioned a filter 8 for adjusting the colors of a reproduced image and a condenser lens 9 for concentrating the light reflected from the original document on the subject holder 2 and passing through the filter 8. The filter 8 and the condenser lens 9 are supported by an attachment plate 10 which is positioned below the light source 6. A pair of horizontally spaced reflecting mirrors 11 is positionally adjustably supported on an attachment plate 12 positioned below and between the condenser lens 9 and the exposure table 7. The reflecting mirrors 11 serve to adjust the length of the optical path from the subject holder 2 to the exposure table 7 and also focus an image on the exposure table 7. The light applied to and reflected from the original document on the subject holder 2 passes through the filter 8 and the condenser lens 9, and is then reflected by the reflecting mirrors 11 toward the exposure table 7.

A cartridge 14 is detachably mounted in an upper portion of the housing 1, and a takeup shaft 15 also is rotatably supported in the upper portion of the housing 1. The cartridge 14 stores a roll of elongate microcapsule sheet 13 which is coated with microcapsules encapsulating therein dyes for reproducing color images. The microcapsule sheet 13 is withdrawn from the cartridge 14 and wound around the takeup shaft 15 by a plurality of feed rolls 16 which are positioned along a sheet feed path between the cartridge 14 and the takeup shaft 15. While the microcapsule sheet 13 is being fed along the sheet feed path, a portion of the microcapsule sheet 13 which passes underneath the exposure table 7 is exposed to the light from the original document so that a latent image of the original document is formed on the exposed region of the microcapsule sheet 13.

A cassette 18 storing a stack of color developer sheets 17 of a certain size is detachably mounted in a lower portion of the housing 1 below the exposure table 7. A pressure developing unit 19 for developing a latent image under pressure is disposed between the exposure table 7 and the takeup shaft 15. The exposed region of the microcapsule sheet 13 and a color developer sheet 17 are superposed and pressed against each other in the pressure developing unit 19, thus forming a color image on the color developer sheet 17 based on the latent image on the microcapsule sheet 13. The color developer sheet 17 comprises a base, a layer of color developers coated on the base, and a hot melt surface resin layer coated on the color developer layer. The base may be in the form of a sheet of paper which has a smaller thermal capacity or a sheet of PET (polyethylene terephthalate) having a larger thermal capacity The cassette 18 has a finger 18a projecting from one end thereof, the finger 18a being sized, positioned or otherwise characterized depending on the size of the color developer sheets 17 contained in the cassette 18. A size detector 20 for detecting the size of the color developer sheets 17 in the cassette 18 by detecting the size, position, or the like of the finger 18a is disposed in the housing 1 near the cassette 18.

A plurality (a pair in FIG. 1) of feed rollers 21 for feeding a color developer sheet 17 toward the pressure developing unit 19 are disposed between the cassette 18 and the pressure developing unit 19. A sheet guide 25 for guiding the color developer sheet 17 toward the pressure developing unit 19 is positioned between the feed rollers 21 and the pressure developing unit 19. A separator roller 22 for separating a color developer sheet 17 from the microcapsule sheet 13 is disposed downstream of the pressure developing unit 19 with respect to the sheet feed path of the microcapsule sheet 13. A sheet heating device 23 according to the present invention for thermally fixing a developed image on a color developer sheet 17 is positioned downstream of the separator roller 22 with respect to the direction in which the color developer sheet 17 is fed from the pressure developing unit 19. The color developer sheet 17 discharged from the sheet heating device 23 is fed onto a tray 24 attached to the housing 1.

The copying machine thus constructed operates as follows; When a start button (not shown) is depressed, the subject holder 2 is horizontally moved to the rightmost end of its stroke until the leftmost end of an original document placed on the subject holder 2 faces the halogen lamp 4, which is then turned on. Thereafter, the subject holder 2 is moved back to the left during which time light emitted from the light source 6 is applied to the original document.

While the original document is being irradiated by the light, the microcapsule sheet 13 is moved across the exposure table 7 from the cartridge 14 to the takeup shaft 15 at the same speed as the speed of travel of the subject holder 2. Therefore, a latent image of the original document on the subject holder 2 is formed on the microcapsule sheet 13 by the light reflected from the original document, passing through the filter 8 and the condenser lens 9, and reflected by the reflecting mirrors 11. In synchronism with the return of the subject holder 2 to the left, a color developer sheet 17 is taken out of the cassette 18 and delivered to the pressure developing unit 19. In the pressure developing unit 19, the exposed region of the microcapsule sheet 13 is pressed against the color developer sheet 17, thereby forming a color image on the color developer sheet 17. Thereafter, the color developer sheet 17 is introduced by the feed rollers 16 and the separator roller 22 into the sheet heating device 23 in which the color image is fixed with applied heat. The color developer sheet 17 with the fixed color image is then discharged onto the tray 24.

Figure 2:
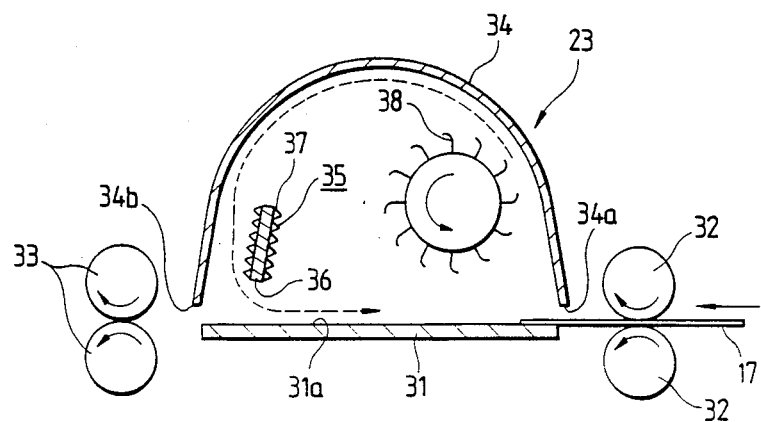
FIG. 2 is a cross-sectional view showing a sheet heating device according to an embodiment of the present invention.
Figure 3:
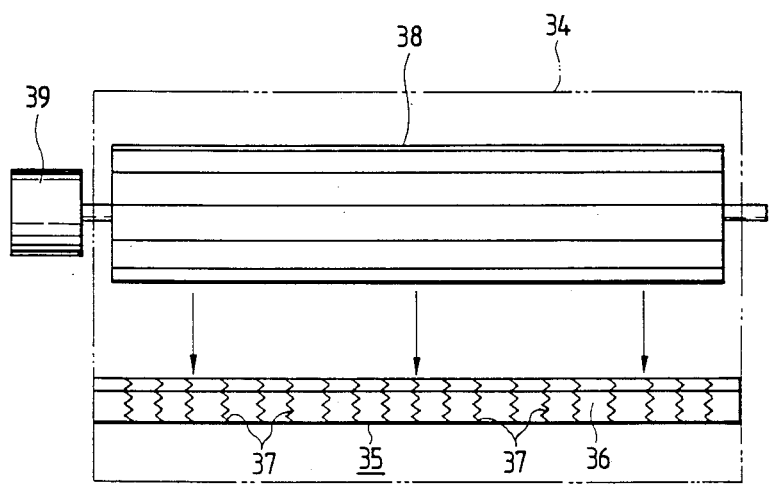
FIG. 3 is a plan view showing the sheet heating device shown in FIG. 2.
Figure 4:
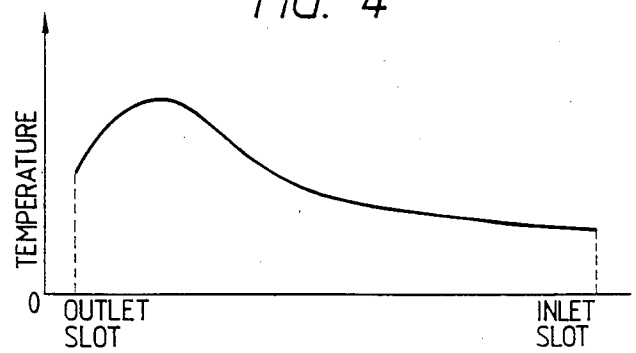
FIG. 4 is a graph showing a temperature distribution along a sheet feed path in the sheet heating device shown in FIGS. 2 and 3.

FIGS. 2 and 3 illustrate a sheet heating device 23 according to an embodiment of the present invention. As shown in FIG. 2, the sheet heating device 23 has a guide plate 31 of iron extending along a sheet feed path of a color developer sheet 17, the guide plate 31 having an upper sheet feed surface 31a on and along which the color developer sheet 17 is fed. A pair of inlet rollers 32 and a pair of outlet rollers 33 are rotatably disposed respectively on inlet and outlet sides of the guide plate 31. The inlet and outlet rollers 32, 33 have their axes extending perpendicularly to the sheet feed path. The inlet rollers 32 are positioned above and below, respectively, the sheet feed path, and the outlet rollers 33 are also positioned above and below, respectively, the sheet feed path. When the rollers 32,33 rotate about their own axes, the color developer sheet 17 is fed on and along the sheet feed surface 31a of the guide plate 31.

A cover 34 having an arch-shaped cross-section is positioned on the guide plate 31 in covering relation to the sheet feed surface 31a, the cover 34 having an inlet slot 34a and an outlet slot 34b in its opposite sides. A heater unit 35 is disposed in the cover 34 near the outlet slot 34b in vertically spaced relation to the guide plate 31. As shown in FIG. 3, the heater unit 35 includes an elongate heat-insulating base plate 36 made of an electrically insulating material such as ceramic. The base plate 36 lies substantially parallel to and faces the inner wall surface of the cover 34 immediately above the outlet slot 34b. The base plate 36 extends substantially the full width of the guide plate 31 in a direction normal to the direction in which the color developer sheet 17 is fed along the sheet feed path. The heater unit 35 also has a coil heater 37 wound around the base plate 36 and composed of vertical parallel turns spaced at certain intervals. When the coil heater 37 is energized, it heats air surrounding the coil heater 37.

An air blower 38 for supplying an air flow toward the heater unit 35 is disposed in the cover 34 behind the heater unit 35, i.e., near the inlet slot 34a and spaced vertically from the guide late 31. The air blower 38 extends the full width of the guide plate 31 across the sheet feed path. The air blower 38 is rotatable about its own axis parallel to the axes of the rollers 32,33 and also the heater unit 35. The air blower 38 can be rotated counterclockwise in FIG. 2 by a motor 39 located outside of the cover 34 and coupled to the shaft of the air blower 38.

While the coil heater 37 is being energized and the air blower 38 is being rotated by the motor 39, heated air flows over and along the upper surface of the color developer sheet 17 on the guide plate 31 in the direction opposite to the direction of travel of the color developer sheet 17, as indicated by the dotted line in FIG. 2. The heated air flows across the entire width of the sheet feed path or the guide plate 31. Therefore, the temperature distribution along the guide plate 31 in the cover 34 is such that the temperature is lowest at the inlet slot 34a and highest near the outlet 34b.

The color developer sheet 17 is introduced from the inlet slot 34a into the cover 34 by the inlet rollers 32 and delivered from the outlet slot 34b out of the cover 34 by the outlet rollers 33. During this time, the color developer sheet 17 starts being heated to the lowest temperature at the inlet slot 34a, and is heated to a progressively higher temperature as it travels along the guide plate 31 from the inlet slot 34a to the outlet slot 34b, and is completely heated to the highest temperature near the outlet slot 34b, through which the color developer sheet 17 is thereafter discharged from the sheet heating device 23.

Since the temperature at the inlet slot 34a is lowest, the color developer sheet 17 is subjected to a lower intensity of heat at the inlet slot 34a, and hence the hot melt materials of the surface resin layer and the color developer layer of the color developer sheet 17 are prevented from bubbling. The progressive heating of the color developer sheet 17 as it moves from the inlet slot 34a to the outlet slot 34b is also effective in preventing the color developer sheet 17 from bubbling The color developer sheet 17 is discharged from the sheet heating device 23 after it has completely been heated at the outlet slot 34b. Therefore, the fixed image on the color developer sheet 17 is of high quality.

Inasmuch as the heated hot air circulates in the cover 34, the heat generated by the heater unit 35 is effectively utilized. The heated air flow is forcibly applied downwardly to the leading end of the color developer sheet 17 near the outlet slot 34b. Therefore, the leading end of the color developer sheet 17 is held against the guide plate 31 and hence is not deflected upwardly away from the guide plate 31, so that no sheet jam is caused at the outlet slot 34b.

The heated air flow travels along the upper surface of the color developer sheet 17 fully across the width of the sheet feed path. Consequently, the color developer sheet 17 can uniformly be heated over its entire surface, so that a high-quality image is produced on the color developer sheet 17.

The heater unit 35 composed of the base plate 36 with the coil heater 37 wound therearound does not take up a large space in the cover 34, with the result that the sheet heating device 23 can be small in size.

Instead of feeding the color developer sheet 17 with the pair of inlet rollers 32 and the pair of outlet rollers 33, it may be fed by an endless feed belt trained around the lower one of the inlet rollers 32 and the lower one of the outlet rollers 33.

Figure 5:
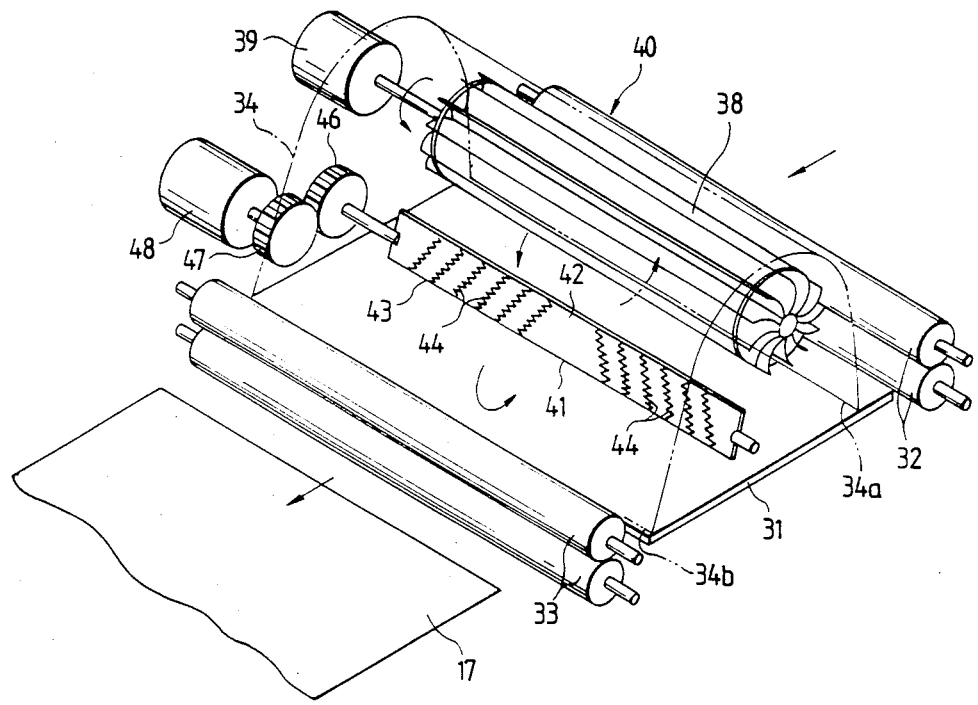
FIG. 5 is a perspective view showing a sheet heating device according to another embodiment of this invention.
Figure 6:
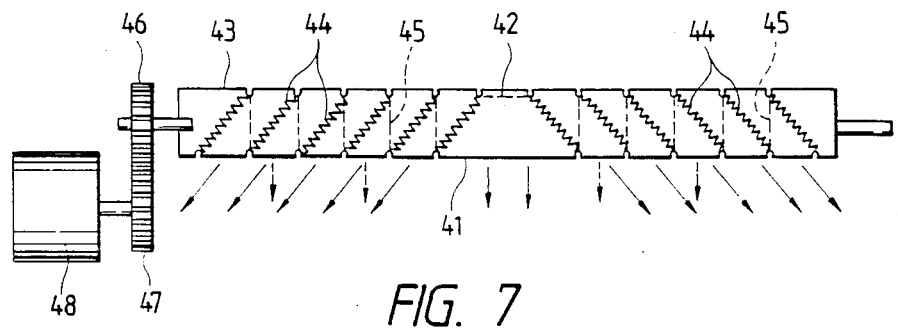
FIGS. 6 and 7 are front elevational views showing different modes of use of a heater unit of the sheet heating device shown in FIG. 5.
Figure 7:
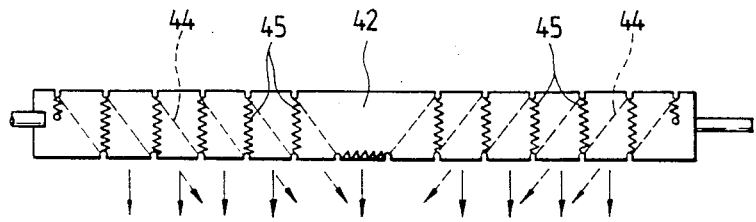

FIGS. 5 through 7 show a sheet heating device 40 according to another embodiment of the present invention. The sheet heating device 40 is similar to the sheet heating device 23 shown in FIGS. 2 and 3 except for a heater unit 41. The heater unit 41 is disposed in the cover 34 and rotatable about its own axis in a plane lying above and parallel to the guide plate 31. The air blower 38 is in the form of a cross-flow fan for supplying air in an amount which is progressively reduced from the axial center of the fan toward the opposite axial ends thereof.

The heater unit 41 includes an elongate heat insulating base plate 42 made of an electrically insulating material. The base plate 42 lies substantially parallel to and faces the inner wall surface of the cover 34 immediately above the outlet slot 34b. The base plate 42 extends substantially the full width of the guide plate 31 in a direction normal to the direction in which the color developer sheet 17 is fed along the sheet feed path. The heater unit 41 also has a coil heater 43 wound around the base plate 42 and composed of first inclined parallel segments 44 disposed on one surface of the base plate 42 and spaced at certain intervals, and second vertical parallel segments 45 disposed on the opposite surface of the base plate 42 and spaced at certain intervals. As shown in FIG. 6, the first inclined parallel segments 44 extend obliquely to the axis of the base plate 42 such that two groups of segments 44, one on each side of the axial center of the base plate 42 are progressively spread away from each other from one side toward the other side of the base plate 42. As shown in FIG. 7, the second vertical parallel segments 45 extend perpendicularly to the axis of the base plate 42 and have opposite ends connected to the opposite ends of the first inclined parallel segments 45.

The base plate 42 has one end coupled to a driven gear 46 disposed outside of the cover 34. The driven gear 46 is held in mesh with a drive gear 47 mounted on the output shaft of a motor 48 which is also located outside of the cover 34. When the motor 48 is energized, the heater unit 41 is angularly moved through the gears 47,46 between a normal-size copy position in which the first heater segments 44 face the inner wall surface of the cover 34 as shown in FIG. 5 and a reduced-size copy position in which the second heater segments 45 face the inner wall surface of the cover 34.

To produce a copy of a normal size from the copying machine, the motor 48 is energized to turn the heater unit 41 into the normal-size copy position as shown in FIG. 5. In this normal size copy position, the first heater segments 44 confront the inner wall surface of the cover 34 near the outlet slot 34b and the outwardly spread ends of the first heater segments 44 are positioned downwardly as shown in FIG. 6. When the coil heater 43 is energized, air surrounding the coil heater 43 is heated, and when the cross flow fan 38 is rotated, it delivers air toward the heater unit 41 in an amount which is progressively reduced from the center toward the opposite sides of the color developer sheet 17.

When the air from the cross-flow fan 38 passes between the surface of the heater unit 41 which supports the first heater segments 44 and the inner wall surface of the cover 34, the air is heated and guided by the first heater segments 44 in an outwardly spread pattern as indicated by the solid line arrows in FIG. 6, so that the heated hot air of a uniform heat intensity across the width of the color developer sheet 17 is applied to the upper surface of the guide plate 31. The hot air circulates along the upper surface of the guide plate 31 and the inner wall surface of the cover 34. A small amount of heated air which flows along the opposite surface of the heater unit 41 is applied along the second heater segments 45 to the guide plate 31 as indicated by the dotted-line arrows in FIG. 6.

Now, the inlet rollers 32 are rotated to introduce the color developer sheet 17 through the inlet slot 34a into the cover 34, and the outlet rollers 33 are also rotated to discharge the color developer sheet 17 out of the cover 34. While the color developer sheet 17 is traveling through the cover 34, therefore the hot air of a uniform heat intensity fully across the color developer sheet 17 is applied to the upper surface thereof. Accordingly, the image on the color developer sheet 17 can reliably be fixed in its entirety.

To produce a reduced-size copy, the heater unit 41 is rotated by 180 degrees from the normal size copy position shown in FIG. 5 to the reduced-size copy position in which the second heater segments 45 face the inner wall surface of the cover 34 near the outlet slot 34b. With the coil heater 43 energized, when the cross flow fan 38 is rotated, it delivers air toward the heater unit 41 and the air from the cross-flow fan 38 passes between the surface of the heater unit 41 which supports the second heater segments 44 and the inner wall surface of the cover 34. The air is heated and guided by the second heater segments 44 substantially vertically as indicated by the solid-line arrows in FIG. 7. The heated hot air is now applied to the upper surface of the guide plate 31 in a pattern such that the heated air is concentrated on the central region of the guide plate 31. The hot air circulates along the upper surface of the guide plate 31 and the inner wall surface of the cover 34. A small amount of heated air which flows along the opposite surface of the heater unit 41 is applied along the first heater segments 44 to the guide plate 31 as indicated by the dotted-line arrows in FIG. 7, with the result that the hot air heated by the first heater segments is also concentrated on the central region of the guide plate 31.

When the color developer sheet 17 passes through the cover 34 at this time, the hot air having a sufficient heat intensity is applied to the upper surface of the color developer sheet 17 at its central region. Therefore, a reduced image in the central region of the color developer sheet 17 can reliably be fixed.

With the embodiment shown in FIGS. 5 thru 7, since air is heated and guided by the first heater segments 44 when producing a normal-size copy, the heat intensity of the hot air applied to the color developer sheet 17 is uniformized across the width of the color developing sheet 17 regardless of the localized heat intensity pattern of the cross-flow fan 38. Consequently, unwanted heat irregularities on the color developer sheet 17 are eliminated.

In this embodiment, only the first heater segments 44 may be provided on the base plate 42, and the second heater segments 45 may be dispensed with. The angle at which the first heater segments 44 are inclined with respect to the longitudinal axis of the base plate 42 may be selected as desired to provide a uniform hot air flow across the width of the guide plate 31.

Figure 8:
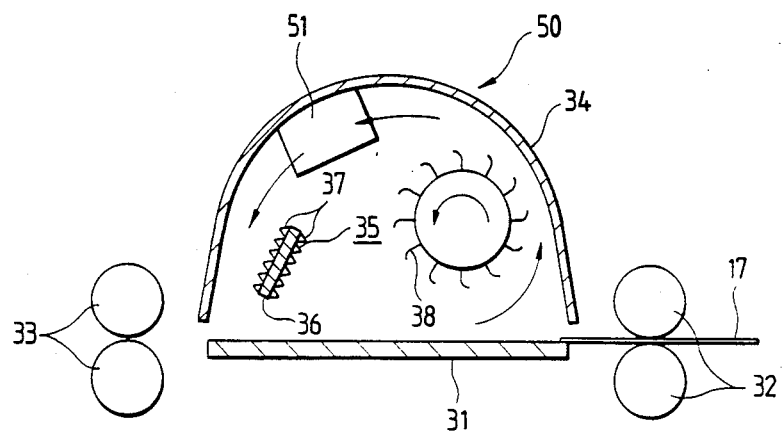
FIG. 8 is a cross-sectional view showing a sheet heating device according to still another embodiment of the present invention.
Figure 9:
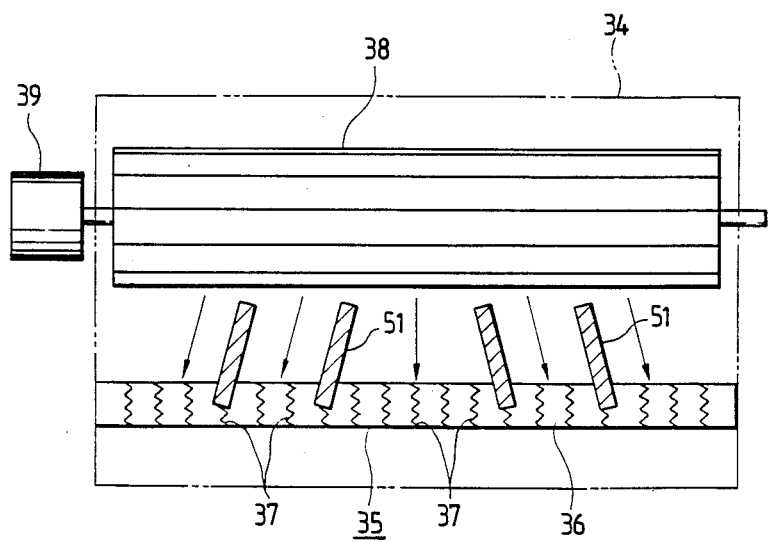
FIG. 9 is a plan view showing the sheet heating device illustrated in FIG. 8.

FIGS. 8 and 9 illustrate a sheet heating device according to still another embodiment of this invention. The sheet heating device 50 differs from the sheet heating device 23 shown in FIGS. 2 and 3 in that the sheet heating device 50 additionally has a plurality of (four in the illustrated embodiment) air flow guide vanes 51 disposed between the air blower 38 in the form of a cross-flow fan and the heater unit 35, and attached to an upper inner wall surface of the cover 34. The air flow guide vanes 51 are spaced at intervals along the cross-flow fan 38 and the heater unit 35. As shown in FIG. 9, the air flow guide vanes 51 are divided into two groups disposed one on each side of the axial center of the cross-flow fan 38. The air flow guide vanes 51 in each group are inclined downstream toward a side of the cover 34.

In operation, the coil heater 37 is energized to heat ambient air and the cross-flow fan 38 is rotated by the motor 39 to supply air in an amount which is progressively reduced from the axial center toward opposite ends of the fan 38. When air supplied from the fan 38 passes between the air flow guide vanes 51, it is guided to flow in a spreading pattern obliquely toward the transversely opposite sides of the cover 34, as indicated by the arrows in FIG. 9. Therefore, the air flow from the fan 38 is corrected in its distribution by the air flow guide vanes 51 so that it is uniformly heated by and along the heater unit 35 and hot air of a uniform heat intensity across the width of the guide plate 31 is applied to the guide plate 31. Accordingly, when the color developer sheet 17 travels over the guide plate 31 through the cover 34, the uniformly heated hot air is applied transversely evenly to the upper surface of the color developer sheet 17 without heat irregularities so that the image on the color developer sheet 17 can reliably be fixed in its entirety. The number and angle of inclination of air flow guide vanes 51 may be selected as desired in order to uniformize the amount of hot air to be applied to the guide plate 31.

Figure 10:
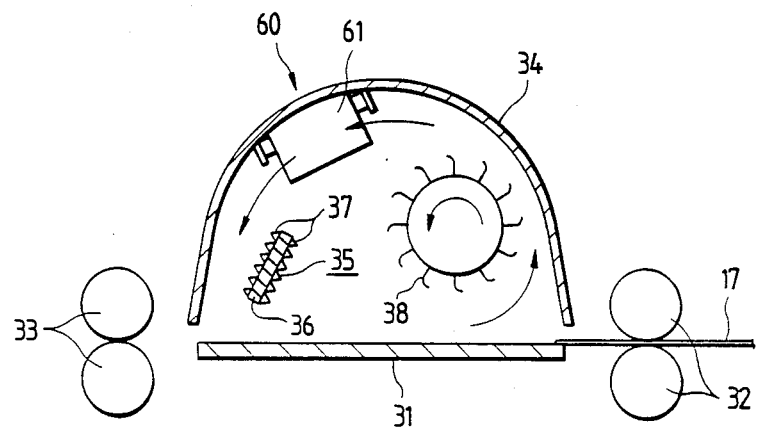
FIG. 10 is a cross-sectional view showing a sheet heating device according to yet another embodiment of the present invention.
Figure 11:
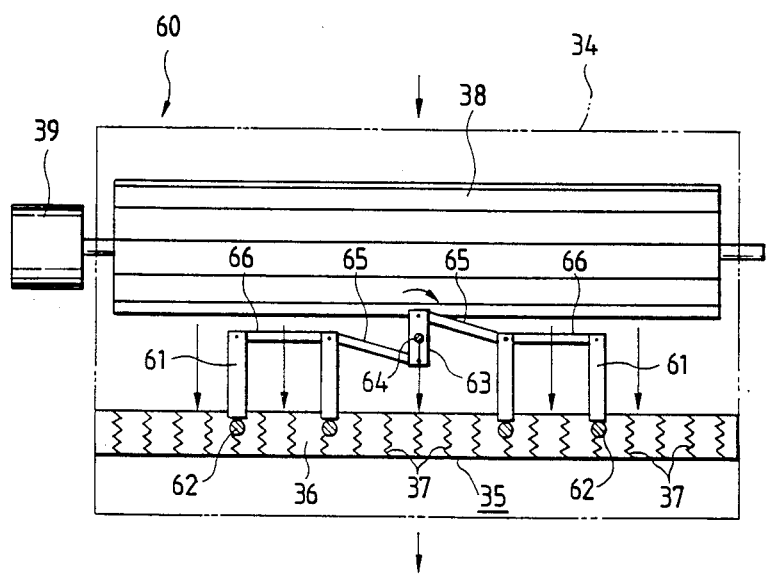
FIGS. 11 and 12 are plan views showing different modes of use of the heating device shown in FIG. 10.
Figure 12:
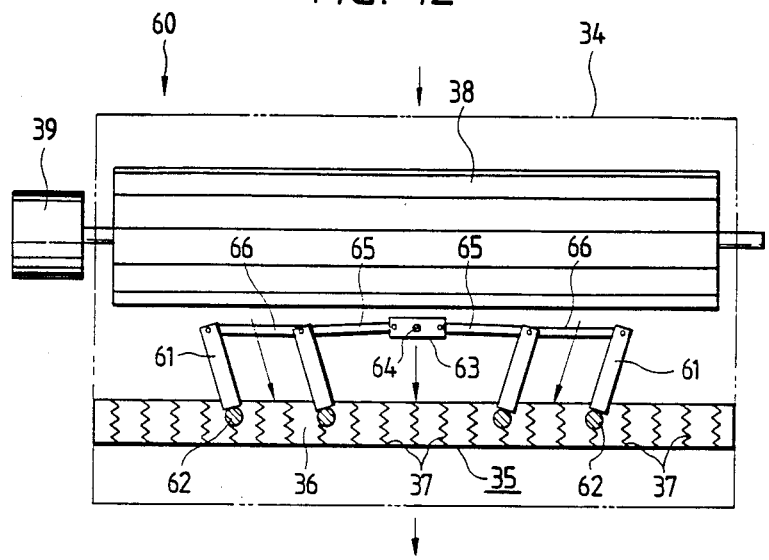

FIGS. 10 thru 12 show a sheet heating device 60 according to yet another embodiment of the present invention. The sheet heating device 60 is similar to the sheet heating device 50 shown in FIGS. 8 and 9 except that a plurality of (four in the illustrated embodiment) air flow guide vanes 61 disposed between the air blower 38 in the form of a cross-flow fan and the heater unit 35 are pivotally attached at ends to the heater unit 35 by pivots 62. The air flow guide vanes 61 are spaced at intervals along the cross-flow fan 38 and the heater unit 35. A switching arm 63 is pivotally attached at its center to an upper inner wall surface of the cover 34 by a pivot shaft 64 which is coupled to an actuator such as a solenoid or the like (not shown). the opposite ends of the switching arm 63 are operatively connected by links 65 to the other ends of the inner air flow guide vanes 61 which are in turn operatively connected to the other ends of the outer air flow guide vanes 61 by other links 66.

If the copying machine is to produce a copy which is calendared to different degrees at central and opposite sides thereof by heating the central and opposite sides of the color developer sheet 17, then the switching arm 63 is angularly moved into the position shown in FIG. 11 by the actuator, thereby causing the links 65,66 to position the air flow guide vanes 61 substantially parallel to the direction in which the color developer sheet 17 is fed. The heater unit 35 is then energized to heat surrounding air.

When the cross-flow fan 38 is rotated, it sends air in an amount which is progressively reduced from the center to opposite ends thereof. The air passes between the parallel air flow guide vanes 61, but the distribution of the amount of air is not changed by the air flow guide vanes 61 as they are parallel to the air flow. As the air flows past the heater unit 35, it is heated and then applied to the guide plate 31.

When the color developer sheet 17 passes through the cover 34 at this time, the hot air which still retains the heat intensity distribution depending on the cross-flow fan 38 is applied to the upper surface of the color developer sheet 17. Accordingly, the image on the color developer sheet 17 is fixed by being heated and calendared to different degrees at its center and opposite sides.

To produce a reduced-size copy, the switching arm 63 is turned by 90 degrees clockwise from the position shown in FIG. 11 to the position shown in FIG. 12. The air flow guide vanes 61 are now angularly positioned by the links 65,66 such that two groups of the air flow guide vanes 61, one on each side of the switching arm 63, are inclined toward each other in a direction toward the heater unit 35 s shown in FIG. 12. The heater unit 35 is energized to heat surrounding air.

Air delivered from the cross-flow fan 38 is deflected by the inclined air flow guide vanes 61 so that more air is supplied to the center of the heater unit 35. The air is then heated by the heater unit 35 and applied to the guide plate 31. While the color developer sheet 17 travels on the guide plate 31 through the cover 34, the hot air is applied to the upper surface of the guide plate 31. Since the hot air is concentrated on the central region of the color developer sheet 17, its reduced image on the central region thereof is reliably fixed by the concentrated hot air thereto.

The switching arm 63 may also be turned counterclockwise from the position of FIG. 11 to tilt the air flow guide vanes 61 such that the two groups thereof are inclined progressively toward each other in an opposite direction toward the cross flow fan 38. When the air flow guide vanes 61 are inclined in this manner, air from the cross-flow fan 38 is uniformized in its distribution across the full width of the guide plate 31. Therefore, the upper surface of the color developer sheet 17 is heated uniformly in its entirety by hot air from the heater unit 35.

Figure 13:
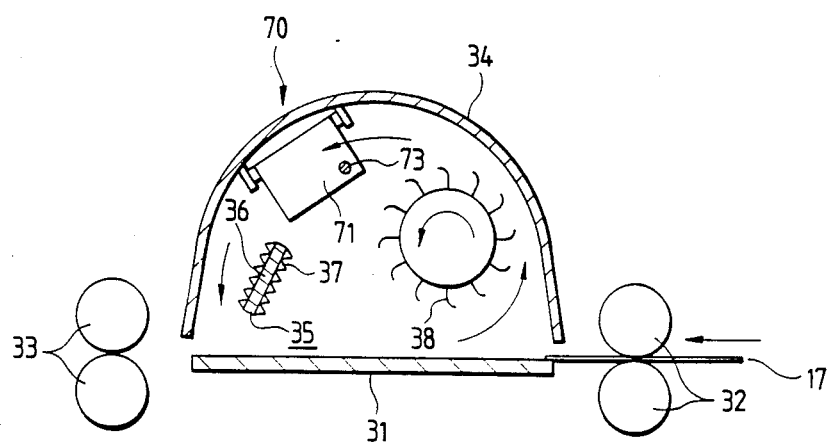
FIG. 13 is a cross-sectional view showing a sheet heating device according to yet still another embodiment of the present invention.
Figure 14:
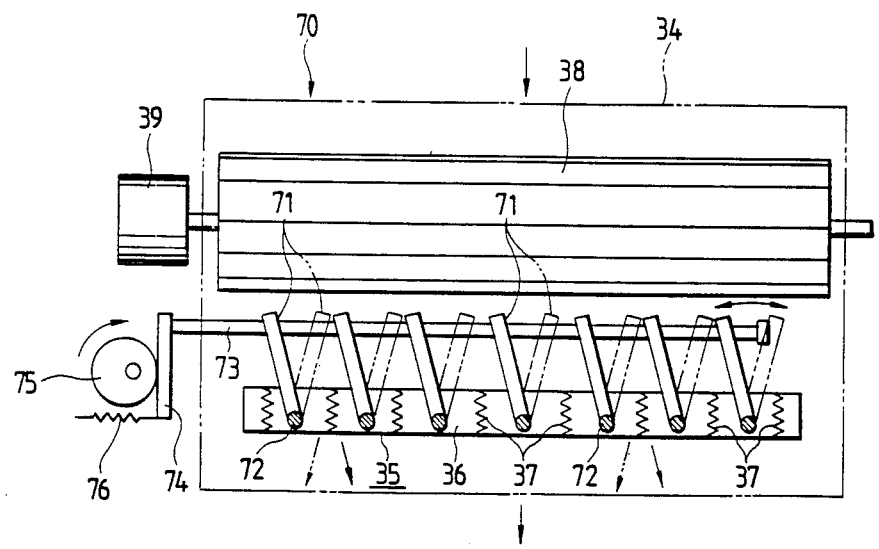
FIG. 14 is a plan view showing the sheet heating device shown in FIG. 13.

FIGS. 13 and 14 show a sheet heating device 70 according to yet still another embodiment of the present invention. The sheet heating device 70 differs from the sheet heating device shown in FIGS. 10 thru 12 in that a plurality of (seven in the illustrated embodiment) air flow guide 71 disposed between the air blower 38 in the form of a cross-flow fan and the heater unit 35 are pivotally attached at ends to the heater unit 35 by pivots 72 and at the other ends to a lever 73 extending parallel to the cross-flow fan 38. The air flow guide vanes 71 are spaced at intervals along the cross-flow fan 38 and the heater unit 35. the lever 73 has an outer end joined to a cam follower lever 74 slidably held against an eccentric cam 75 coupled to an actuator such as a motor (not shown). The cam follower lever 74 is normally urged by a spring 76 to be held against the cam 75.

When the cam 75 is continuously rotated by the actuator, the lever 73 is reciprocally moved along its own axis to angularly move the air flow guide vanes 71 repeatedly between the solid-line position and the two-dot-and-dash line position in FIG. 14.

To fix an image on the color developer sheet 17, the heater unit 35 is energized to heat surrounding air, and the cross-flow fan 38 is rotated to supply air to the heater unit 35. At the same time, the cam 75 is rotated to cause the lever 73 to angularly move the air flow guide vanes 71 back and forth. The air flow supplied from the cross-flow fan 38 is therefore deflected repeatedly in the directions indicated by the solid-line and dotted-line arrows, while the air is circulating along the inner wall surface of the cover 34 and the upper surface of the guide plate 31. As a consequence, the localized distribution of air supplied form the cross-flow fan 38 is corrected, and hot air of a uniform heat intensity across the full width of the guide plate 31 is applied to the guide plate 31.

When the color developer sheet 17 passes through the cover 34 at this time, the upper surface of the color developer sheet 17 is uniformly heated by the hot air guided by the repeatedly swinging air flow guide vanes 71, and hence the image on the color developer sheet 17 can uniformly be heated without heat irregularities.

In each of the above embodiments, the heater unit may comprise plate-like member with a heater embedded therein. A sheet to be heated by the sheet heating device of the present invention may comprise a base in the form of a transparent plastic film. The sheet heating device of the present invention may be incorporated in a monochromatic copying machine instead of the color copying machine.

Although certain preferred embodiments have been shown and described, it should be understood that many changes and modifications may be made therein without departing from the spirit and scope of the invention.

What is claimed is:

1. A sheet heating device for heating a sheet which carries a visible image thereon, the sheet being fed along a sheet feed path while being heated, the device comprising:
    a heater unit extending transversely to and substantially across the sheet feed path, said heater unit comprises a base plate and a coil heater wound over the base plate;
    an air blower for supplying air to the heater unit substantially fully across the sheet feed path and along the surface of the sheet; and
    means for regulating hot air distribution with respect to a lateral direction of the sheet wherein the regulating means comprises the coil heater whose spiral pitch and spiral directions are varied with respect to the lateral direction of the sheet.

2. The sheet heating device as claimed in claim 1, wherein the coil heater has a first spiral arrangement at one surface of the base plate and has a second spiral arrangement at another surface of the base plate, the first spiral arrangement providing a symmetrical and inclined orientation with respect to a center of the base plate in such a manner that the spiral direction is symmetrically oriented toward side edges of the sheet in running direction of the sheet, and the second spiral arrangement providing a spiral direction perpendicular to the running direction of the sheet.

3. The sheet heating device as claimed in claim 2 wherein the regulating means further comprising a drive means for changing angular orientation of the base plate.

4. A sheet heating device for heating a sheet which carries a visible image thereon, the sheet being fed along a sheet feed path while being heated, the device comprising:
    a heater unit extending transversely to and substantially across the sheet feed path;
    an air blower for supplying air to the heater unit substantially fully across the sheet feed path and along the surface of the sheet;
    a cover member covering the heater unit and the air blower; and
    means for regulating hot air distribution with respect to a lateral direction of the sheet wherein the regulating means comprises a plurality of guide plates disposed between the air blower and the heater unit, and fixedly secured to the cover member, the guide plates providing a symmetrical arrangement with respect to a center line extending in the direction of sheet movement for directing hot air toward side edge portions of the sheet.

5. A sheet heating device for heating a sheet which carries a visible image thereon, the sheet being fed along a sheet feed path while being heated, the device comprising:
    a heater unit extending transversely to and substantially across the sheet feed path;
    an air blower for supplying air to the heater unit substantially fully across the sheet feed path and along the surface of the sheet;
    a cover member covering the heater unit and the air blower; and
    means for regulating hot air distribution with respect to a lateral direction of the sheet wherein the regulating means comprises a plurality of guide plates each guide plate having a base end and a swingable end, the base ends being pivotally supported to the cover member, drive means for pivotally moving the plurality of guide plates, and linking members connecting between the drive means and swingable ends of the guide plates, orientations of the guide plates being changeable.

6. The sheet heating device as claimed in claim 5 wherein the drive means is positioned at a central position of the cover member for providing movement of at least one guide plates with respect to the sheet feed path.

7. The sheet heating device as claimed in claim 5, wherein the drive means comprises an eccentric cam and a rod member movable reciprocally in axial direction thereof, the swingable ends of the guide plates being connected to the rod member for providing a parallel rocking motions of the all guide plates.

8. A sheet heating device for heating a sheet having a surface while it is being fed along a sheet feed path in a direction, comprising:
    a heater unit extending transversely to and substantially fully across the sheet feed path, and
    an air blower for supplying air to said heater unit substantially fully across the sheet feed path and along the surface of the sheet in a direction opposite to the direction in which the sheet is fed along the sheet feed path, wherein the air blower comprises a cross-flow fan, the heater unit comprising an elongate base plate and a coil heater wound around the base plate and composed of first inclined heater segments disposed at spaced intervals on one surface of the base plate and second parallel heater segments disposed at spaced intervals on an opposite surface of the base plate, the first heater segments being divided into two groups which are progressively spread away from each other from one side toward the other side of the base plate.

9. The sheet heating device as claimed in claim 8, wherein the heater unit is angularly movable about its own axis between a position in which the other side of the base plate is positioned remotely from the air blower and a position in which the one side of the base plate is positioned remotely from the air blower.

10. The sheet heating device as claimed in claim 8, further comprising a cover covering the heater unit and the air blower, the cover having an inlet slot and an outlet slot, the sheet feed path extending through the inlet and outlet slots, the heater unit being positioned near the outlet slot, the air blower being positioned behind the heater unit with respect to the direction in which the sheet is fed.

11. The sheet heating device as claimed in claim 10, further comprising a guide plate disposed underneath the cover and having an upper surface along which the sheet feed path is defined, the cover having an arch-shaped crosssection extending over the guide plate.

12. A sheet heating device for heating a sheet while it is being fed along a sheet feed path, comprising:
a heater unit extending transversely to and substantially fully across the sheet feed path;
a cross-flow fan for supplying air to the heater unit substantially fully across the sheet feed path and along a surface of the sheet in a direction opposite to the direction in which the sheet is fed along the sheet feed path;
a cover covering the heater unit and the crossflow fan; and
a plurality of air flow guide vanes for guiding an air flow from the cross-flow fan toward the heater unit, the air flow guide vanes being fixedly attached to an inner wall surface of the cover, disposed between the heater unit and the crossflow fan and spaced at intervals along the heating unit, the air flow guide vanes being divided into two groups disposed one on each side of the axial center of the cross-flow fan, the air flow guide vanes in each group being inclined toward one side of the cover in a direction away from the cross flow fan.

13. A sheet heating device for heating a sheet while it is being fed along a sheet feed path, comprising:
a heater unit extending transversely to and substantially fully across the sheet feed path;
a cross-flow fan for supplying air to the heater unit substantially fully across the sheet feed path and along a surface of the sheet in a direction opposite to the direction in which the sheet is fed along the sheet feed path;
a cover covering the heater unit and the crossflow fan; and
a plurality of air flow guide vanes for guiding an air flow from the cross-flow fan toward the heater unit, the air flow guide vanes being disposed between the heater unit and the cross-flow fan, spaced at intervals along the heating unit, and pivotally attached at ends to the heater unit, a switching arm pivotally attached to the cover and a plurality of links pivotally attached to the opposite ends of the air flow guide vanes and the switching arm, the switching arm being angularly movable about an axis thereof for angularly moving the air flow guide arms in unison selectively between a plurality of angularly different positions.

14. A sheet heating device for heating a sheet while it is being fed along a sheet feed path, comprising:
a heater unit extending transversely to and substantially fully across the sheet feed path;
a cross-flow fan for supplying air to the heater unit substantially fully across the sheet feed path and along a surface of the sheet in a direction opposite to the direction in which the sheet is fed along the sheet feed path;
a cover covering the heater unit and the crossflow fan; and
a plurality of air flow guide vanes for guiding an air flow from the cross-flow fan toward the heater unit, the air flow guide vanes being disposed between the heater unit and the cross-flow fan and spaced at intervals along the heating unit wherein the air flow guide vanes are pivotally attached at ends to the heater unit, a lever pivotally attached to the opposite ends of the air flow guide vanes, and means for moving the lever for angularly moving the air flow guide arms in unison repeatedly between angularly different positions.

* * * * *